(12) United States Patent
Cheng et al.

(10) Patent No.: US 10,886,169 B2
(45) Date of Patent: Jan. 5, 2021

(54) AIRGAP FORMATION IN BEOL INTERCONNECT STRUCTURE USING SIDEWALL IMAGE TRANSFER

(71) Applicant: International Business Machines Corporation, Armonk, NY (US)

(72) Inventors: Kangguo Cheng, Schenectady, NY (US); Ekmini A. De Silva, Slingerlands, NY (US); Juntao Li, Cohoes, NY (US); Yi Song, Albany, NY (US); Peng Xu, Santa Clara, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/598,458

(22) Filed: Oct. 10, 2019

(65) Prior Publication Data

US 2020/0051850 A1 Feb. 13, 2020

Related U.S. Application Data

(62) Division of application No. 15/989,327, filed on May 25, 2018, now Pat. No. 10,490,447.

(51) Int. Cl.
| | |
|---|---|
| *H01L 21/768* | (2006.01) |
| *H01L 21/311* | (2006.01) |
| *H01L 21/762* | (2006.01) |
| *H01L 23/522* | (2006.01) |
| *H01L 23/528* | (2006.01) |

(Continued)

(52) U.S. Cl.
CPC .... *H01L 21/7682* (2013.01); *H01L 21/31144* (2013.01); *H01L 21/76205* (2013.01); *H01L 21/76831* (2013.01); *H01L 21/76849* (2013.01); *H01L 21/76897* (2013.01); *H01L 23/528* (2013.01); *H01L 23/5226* (2013.01); *H01L 23/53238* (2013.01); *H01L 21/0273* (2013.01)

(58) Field of Classification Search
CPC .............. H01L 21/7682; H01L 23/528; H01L 23/5226; H01L 21/76205; H01L 23/53238; H01L 21/31144; H01L 21/76897; H01L 21/76849; H01L 21/76831; H01L 21/0273
See application file for complete search history.

(56) References Cited

U.S. PATENT DOCUMENTS

| | | | |
|---|---|---|---|
| 6,063,506 A * | 5/2000 | Andricacos | H01L 23/49822 428/546 |
| 6,063,688 A | 5/2000 | Doyle | |
| 6,297,554 B1 | 10/2001 | Lin | |

(Continued)

OTHER PUBLICATIONS

Kangguo Cheng et al., "Airgap Formation in BEOL Interconnect Structure Using Sidewall Transfer", U.S. Appl. No. 15/989,327, filed May 25, 2018.

(Continued)

*Primary Examiner* — Syed I Gheyas
(74) *Attorney, Agent, or Firm* — Cantor Colburn LLP; Daniel Morris

(57) ABSTRACT

A method and structure of forming air gaps with a sidewall image transfer process such as self-aligned double patterning to reduce capacitances. Different materials can be provided in the mandrel and non-mandrel regions to enlarge a process window for metal line end formation.

12 Claims, 14 Drawing Sheets

(51) Int. Cl.
*H01L 23/532* (2006.01)
*H01L 21/027* (2006.01)

(56) References Cited

U.S. PATENT DOCUMENTS

| | | |
|---|---|---|
| 6,335,257 B1 | 1/2002 | Tseng |
| 7,666,753 B2 | 2/2010 | Bonilla et al. |
| 7,943,480 B2 | 5/2011 | Edelstein et al. |
| 8,455,364 B2 | 6/2013 | Kanakasabapathy |
| 9,159,606 B1 * | 10/2015 | Purayath ............. H01L 21/7682 |
| 9,171,796 B1 | 10/2015 | Brink |
| 9,384,978 B1 | 7/2016 | Lin |
| 9,396,989 B2 | 7/2016 | Purayath et al. |
| 9,892,961 B1 | 2/2018 | Cheng et al. |
| 2003/0176055 A1 * | 9/2003 | Wu .................... H01L 21/7682 |
| | | 438/618 |
| 2009/0294898 A1 | 12/2009 | Feustel et al. |
| 2010/0130016 A1 | 5/2010 | Devilliers |
| 2013/0032949 A1 | 2/2013 | Lin |
| 2015/0035064 A1 | 2/2015 | Cheng |
| 2015/0035081 A1 | 2/2015 | Cheng |
| 2015/0060856 A1 | 3/2015 | Tyberg et al. |
| 2015/0102496 A1 * | 4/2015 | Zhang ................ H01L 23/5226 |
| | | 257/774 |
| 2015/0162277 A1 | 6/2015 | Zhang et al. |
| 2016/0336216 A1 * | 11/2016 | Hsiao ................ H01L 21/76877 |
| 2018/0053823 A1 | 2/2018 | Mallela et al. |

OTHER PUBLICATIONS

List of IBM Patents or Patent Applications Treated as Related; (Appendix P), Date Filed Oct. 10, 2019; 2 pages.

* cited by examiner

AIRGAP FORMATION IN BEOL INTERCONNECT STRUCTURE USING SIDEWALL IMAGE TRANSFER

DOMESTIC PRIORITY

This application is a divisional of U.S. application Ser. No. 15/989,327 titled "Airgap Formation in BEOL Interconnect Structure Using Sidewall Image Transfer" filed May 25, 2018, the contents of which are incorporated by reference herein it its entirety.

BACKGROUND

This invention generally relates to integrated circuits and methods of fabrication. More particularly, the present invention relates to back end of the line (BEOL) interconnect structures and methods of forming airgaps between metal lines using a sidewall image transfer process such as a self-aligned double patterning (SADP) process.

Typical integrated circuits are formed by first fabricating individual semiconductor devices using processes referred to generally as the front end of line (FEOL). Thereafter, the individual devices on the integrated circuit are interconnected by forming the wiring of the wafer using processes referred to generally as the back end of line (BEOL). In the BEOL, the individual devices (transistors, capacitors, resistors, etc.) are interconnected with interconnects and a metallization layer, which function as the wiring network of the wafer. Common metals that are used to form the metallization layers and interconnects are copper, cobalt, tungsten, and aluminum. BEOL generally begins when the first layer of metal (M0) is deposited on the wafer. BEOL includes contacts, insulating layers (dielectrics), metal levels, and bonding sites for chip-to-package connections. Double patterning processes such as self-aligned double patterning (SADP) or litho-etch-litho etch (LELE) are typically part of the BEOL process for advanced design rules.

SUMMARY

Embodiments of the present invention are generally directed to semiconductor structures including back end of the line (BEOL) interconnect structures and methods for forming the semiconductor structures including formation of airgaps between metal lines. A non-limiting example of a BEOL interconnect structure in accordance with one or more aspects of the present invention includes a plurality of lines including a metal conductor separated by a space having a width of less than 20 nm. The plurality of metal conductor lines are provided on an ultralow k dielectric and an oxide is provided in the space including an airgap therein.

A non-limiting example of a sidewall image transfer method of forming a BEOL interconnect structure in accordance with one or more aspects of the present invention includes forming a mandrel pattern including oxide spacers on sidewalls thereof on a BEOL stack, wherein the BEOL stack includes an ultralow k dielectric layer and a hardmask layer on the ultralow k dielectric layer. The sidewall oxide spacers are transferred into the ultralow k dielectric layer to form openings in the ultralow k dielectric layer having a width equal to a width dimension of the sidewall oxide spacers. A non-conformal ultralow k dielectric is deposited into the openings, wherein the ultralow k dielectric pinches at a bottom and top of the opening to form a dielectric including an airgap therein, wherein the dielectric including the airgap therein is intermediate adjacent metal conductor lines.

A self-aligned double patterning (SADP) method of forming a BEOL interconnect structure in accordance with one or more aspects of the present invention includes forming a mandrel pattern including oxide spacers on sidewalls thereof on a BEOL stack, wherein the BEOL stack includes an ultralow k dielectric layer and a hardmask layer on the ultralow k dielectric layer. Exposed portions of the hardmask layer and a portion of the ultralow k dielectric layer underlying the hardmask layer are directionally etching to form a first trench opening and filled with a nitride. The mandrel pattern, the hardmask layer underlying the mandrel pattern and a portion of the underlying ultralow k dielectric underlying the hardmask layer is pulled pulling to form a second trench opening and filled with an oxide. A first block mask is deposited overlying a portion of a non-mandrel region and the non-mandrel region free of the first block mask is patterned by selectively removing the nitride so as to form openings therein. The first block mask is removed and a second block mask is deposited overlying a portion of a mandrel region. The mandrel region free of the second block mask is patterned by selectively removing the exposed oxide so as to form openings therein and the second block mask is removed. The openings in the mandrel region and in the non-mandrel region are filled with a metal conductor to form metal lines. A portion of the ultralow k dielectric between the metal lines is removed to form openings therebetween, wherein a width dimension of the opening are substantially equal to a width dimension of the sidewall oxide spacer and non-conformal ultralow k dielectric into the openings, wherein the ultralow k dielectric pinches at a bottom portion and a top portion of the openings to form an airgap therein.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
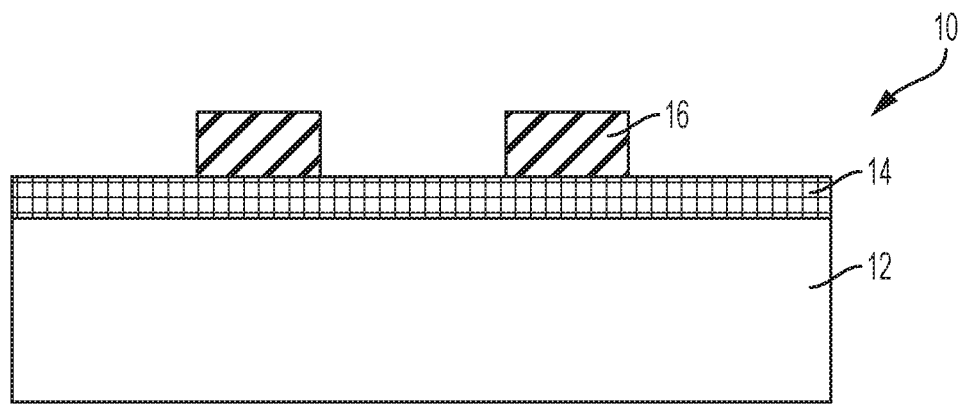
FIG. 1 is a cross-sectional view depicting a semiconductor structure at an intermediate stage of manufacturing for advanced design rules in accordance with an embodiment of the present invention.

It will be appreciated that for simplicity and clarity of illustration, elements shown in the drawings have not necessarily been drawn to scale. For example, the dimensions of some of the elements can be exaggerated relative to other elements for purpose of clarity.

DETAILED DESCRIPTION

Integrated circuits typically have interconnect levels, each level consisting of metallic lines and vias that are often formed using damascene process (via plus next level conductor). The metallic lines and vias are of the same or different conductive material. The conductive materials can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. Alloys based on copper with an additive metal (such as Ti or Sn) can also be used.

As dimensions such as metal line pitch within an interconnect level continue to shrink along with front end of line (FEOL) pitch, the spaces between metal lines also become limited. For the 7 nm technology node, patterning requirements include a metal pitch of 40 nm or less. This narrow pitch requirement forces the use of spacer based pitch multiplication techniques. Moreover, an ultra-low k material or airgap is needed to provide lower capacitance between the tightly pitched metal lines. The present invention is generally directed to methods and structures of forming these airgaps during back end of line (BEOL) processing using a self-aligned double patterning (SADP) spacer based pitch multiplication technique to provide the desired pitch and features sizes.

A basic SADP process is one of the techniques for processing metal layers at the 10 nanometers (nm) technology node and below. SADP uses a deposition and etch step process to create spacers surrounding a patterned shape. As understood by one skilled in the art, there are two masking steps: the first mask is called the mandrel mask and the second mask is called the block mask. These masks are quite different from the masks normally utilized in single-patterning or litho-etch-litho-etch (LELE) double patterning processes. Because spacer material is deposited on each side of the mandrel pattern, two shapes are created for every one shape originally defined, essentially pitch splitting the original lines (e.g., two mandrel mask shapes produce four spacers at half the pitch). In the metal process application of the present invention, the spacers define the gaps that will become airgaps between the trenches filled with a metal conductor to form the interconnect wires.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can be understood to include any integer number greater than or equal to one, i.e. one, two, three, four, etc. The terms "a plurality" can be understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Moreover, numerous specific details are set forth in the following description, such as particular structures, components, materials, dimensions, processing steps and techniques, in order to provide a thorough understanding of the present invention. However, it will be appreciated by one of ordinary skill in the art that the present invention can be practiced without these specific details. In other instances, well-known structures or processing steps have not been described in detail in order to avoid obscuring the present invention. Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, back end of line (BEOL) processes are generally focused on forming metal interconnects between the different devices of the integrated circuit whereas the fabrication of the different devices that make up the integrated circuit are generally done during the front end of line (FEOL) processing.

Exemplary applications/uses to which the present invention can be applied include, but are not limited to: transistors for complementary metal-oxide-semiconductor (CMOS) devices, logic devices (e.g., NAND gates, NOR gates, XOR gates, etc.), memory devices (e.g., DRAM, SRAM, flip-flops, etc.), and complex (e.g., VLSI, ULSI, etc.) application specific integrated circuits (ASICS) and processors.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer can be formed by a first process (e.g., ALD, PEALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps can be varied within the scope of the present invention.

It should also be noted that certain features may or may not be shown in all figures for the sake of clarity. This is not intended to be interpreted as a limitation of any particular embodiment, or illustration, or scope of the claims.

Referring now to the drawings in which like numerals represent the same or similar elements and initially to FIG.

1, a cross sectional view of a semiconductor structure 10 at an intermediate stage of manufacturing an interconnect level for advanced design rules is generally shown, in accordance with an embodiment of the present invention. The semiconductor structure 10 includes an ultralow k dielectric layer 12 having a planarized upper surface, a hardmask layer 14 on the planar upper surface, and an amorphous silicon (aSi) mandrel pattern 16 on the hardmask layer 14, all of which typically overlay a variety of front end of line devices formed on a substrate (not shown). As will be described in greater detail, the interconnect level formed during a BEOL process includes metal lines at a relatively tight pitch formed in the ultralow k dielectric layer 12. The depicted interconnect level is not intended to be limited and is generally shown to illustrate the versatility in forming metal lines at a tight pitch with airgaps therebetween to further reduce capacitance and to illustrate structural stability when defining line ends within a metal line, which can be problematic when using ultralow k dielectrics and relatively small feature sizes.

The ultralow k dielectric layer 12 generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide (s) such as tetraetehoxysilane (TEOS).

The hardmask layer 14 can be metal oxide or nitride deposited at lower temperature (e.g., less than 400° C.), such as a Ti-based or Al-based or Ta-based metal oxide or nitride/oxynitride, and the like. In one or more embodiments, multiple layers can be used to define the hardmask layer 14.

In various embodiments, the substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe.

In one or more embodiments, the substrate can have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface semiconductor layer of the substrate can be on a substrate insulator layer (e.g., buried oxide layer (BOX)). The substrate can also have other layers forming the substrate, including high-k oxides and/or nitrides.

In one or more embodiments, a substrate insulator layer (e.g., BOX layer) can be formed on at least a portion of a substrate. A semiconductor active surface layer (ASL) can be on the BOX layer. The active surface layer can be on the buried oxide (BOX) layer that can physically separate and electrically insulate the active layer from a mechanically supporting portion of the substrate.

In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) active surface layer. In one or more embodiments, the substrate 16 can be a silicon wafer.

In one or more embodiments, one or more active or passive devices, for example, transistors, resistors, capacitors, junction diodes, and inductors, can be formed on a substrate, where the one or more active or passive devices can be formed through FEOL processes, where the actual device layers and components can be fabricated by processes known in the art. The active devices can be semiconductor devices formed on and/or in the substrate.

Figure 2:
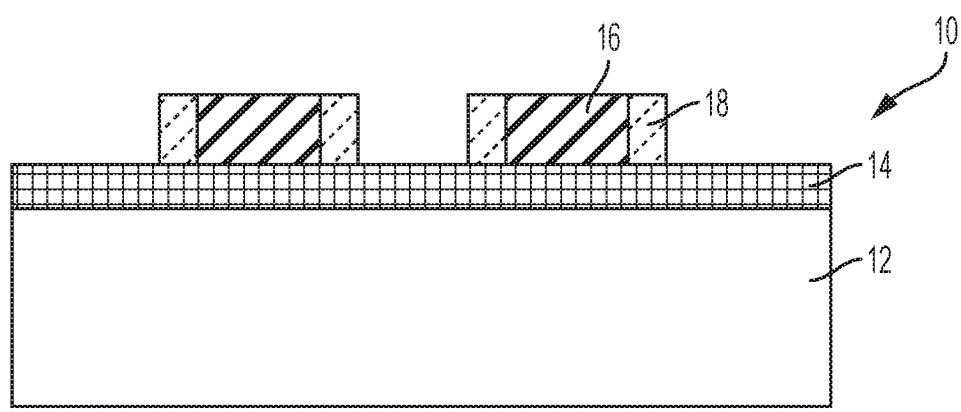
FIG. 2 depicts a cross sectional view of the semiconductor structure of FIG. 1 subsequent to deposition of a conformal oxide layer and directionally etching to form sidewall spacer layers on a mandrel pattern.

FIG. 2 depicts a cross sectional view of the semiconductor structure 10 of FIG. 1 subsequent to deposition of a conformal oxide layer onto the substrate that is directionally etched, e.g., reactive ion etching, to form sidewall spacer layers 18 on the aSi mandrel pattern 16. In one or more embodiments, the sidewall spacers 18 have a width dimension of less than 20 nm; in one or more other embodiments, the sidewall spacers 18 have a width dimension of less than 15 nm; and in still one or more other embodiments, the sidewall spacers 18 have a width dimension of less than 10 nm. As will be apparent from the description below, the sidewall spacers 18 are sacrificial and will define the width dimension of the spaces in which the airgap dielectric material is formed between adjacent metal lines.

Figure 3:
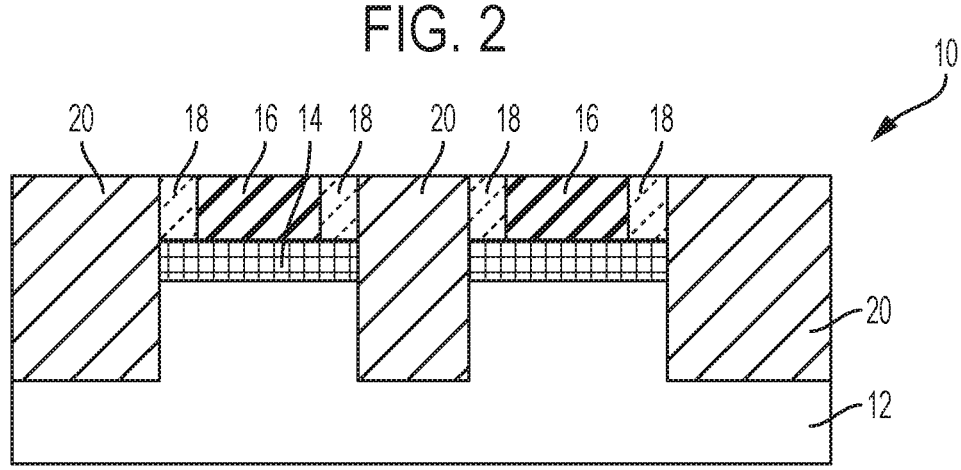
FIG. 3 depicts a cross sectional view of the semiconductor structure of FOG. 2 subsequent to reactive ion etching of a hardmask and ultralow k dielectric layer aligned to the sidewall spacer and mandrel pattern followed by a nitride fill and planarization.

FIG. 3 depicts a cross sectional view of the semiconductor structure 10 of FIG. 2 subsequent to reactive ion etching of the exposed hardmask 14 and underlying ultralow k dielectric layer 12, i.e., the spacer 18 and mandrel pattern 16 acting as a hardmask to form openings extending into a portion of the ultralow k dielectric followed by deposition of a nitride 20 in the opening, e.g., silicon nitride. The semiconductor structure 10 can then be subjected to a planarization process to planarize the upper surface thereof as shown.

Figure 4:
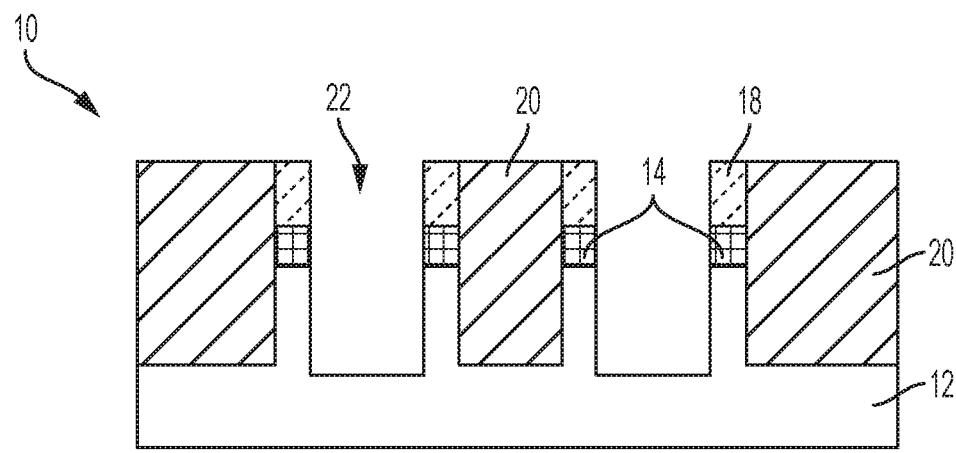
FIG. 4 depicts a cross sectional view of the semiconductor structure of FIG. 3 subsequent to a selective pull of the aSi mandrel pattern, the underlying hardmask and the underlying ultralow k dielectric to form trench openings extending into the ultralow k dielectric layer.

FIG. 4 depicts a cross sectional view of the semiconductor structure 10 of FIG. 3 subsequent to a selective pull of the aSi mandrel pattern 16, the underlying hardmask 14 and the underlying ultralow k dielectric 12 to form trench openings 22 extending into a portion of the ultralow k dielectric layers 12. A directional etch such as a reactive ion etch process can be used to remove the various materials.

Figure 5:
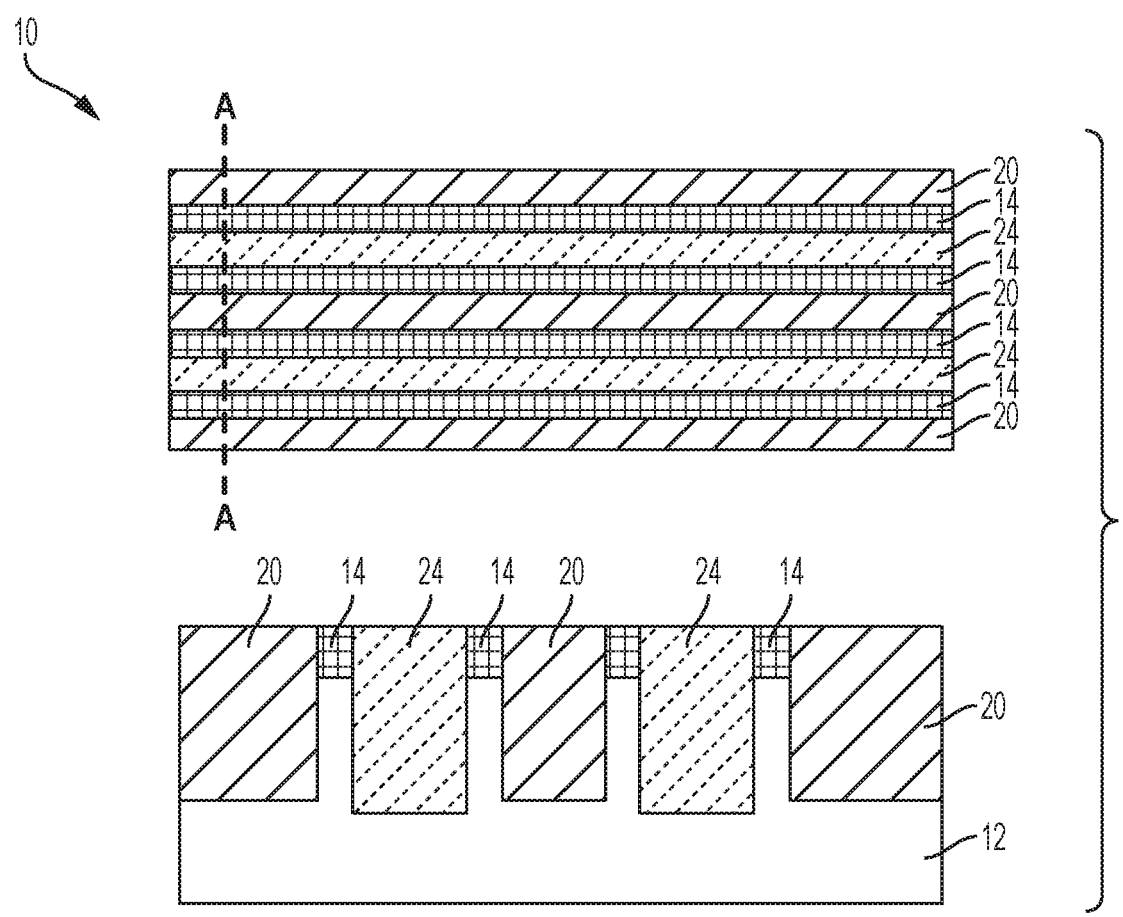
FIG. 5 depicts a top down view and cross sectional view taken along lines A-A of the top down view of the semiconductor structure of FIG. 4 subsequent to filling the trench openings with an oxide followed by planarization.

FIG. 5 depicts a top down view and cross sectional view taken along lines A-A of the top down view of the semiconductor structure 10 of FIG. 4 subsequent to filling the trench openings 22 with an oxide 24. The oxide 24 can be the same or a different oxide than that used for the sidewall spacers 18. The structure 10 is then subjected to a planarization process to the hardmask 14.

Figure 6:
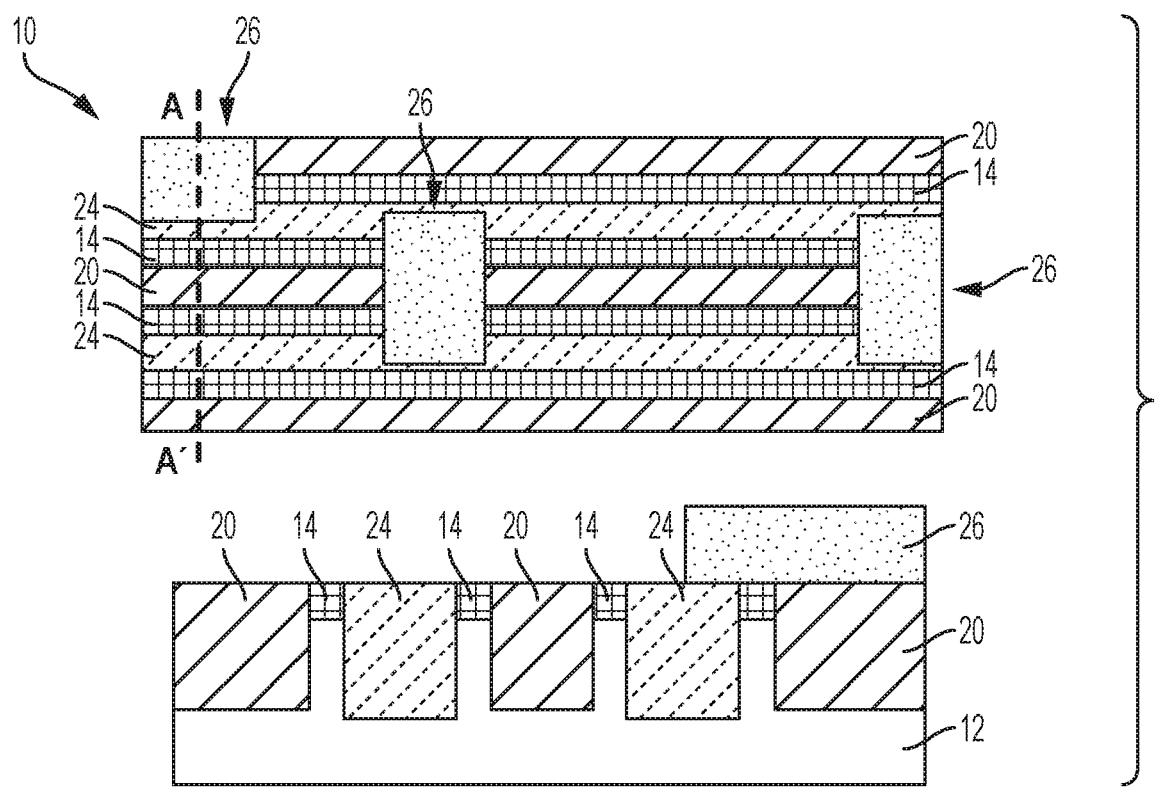
FIG. 6 depicts a top down view and cross sectional view taken along lines A-A of the top down view of the semiconductor structure of FIG. 5 subsequent to applying a block mask onto a portion of one or more of the nitride layers so as to selectively pattern the non-mandrel region.

FIG. 6 depicts a top down view and cross sectional view taken along lines A-A of the top down view of the semiconductor structure 10 of FIG. 5 subsequent to applying a first block mask 26 onto a portion of one or more of the nitride layers 20 so as to selectively pattern the non-mandrel region (regions of the substrate generally not overlying the mandrel pattern as shown). A large process window is provided to define the metal interconnect line ends in the non-mandrel region because of the relatively large distance from a masked portion of the nitride layer to an exposed adjacent nitride layer 20 in the non-mandrel region. The particular location of the mask is not intended to be limited to that shown and will generally depend on the intended design considerations for the interconnect level.

Figure 7:
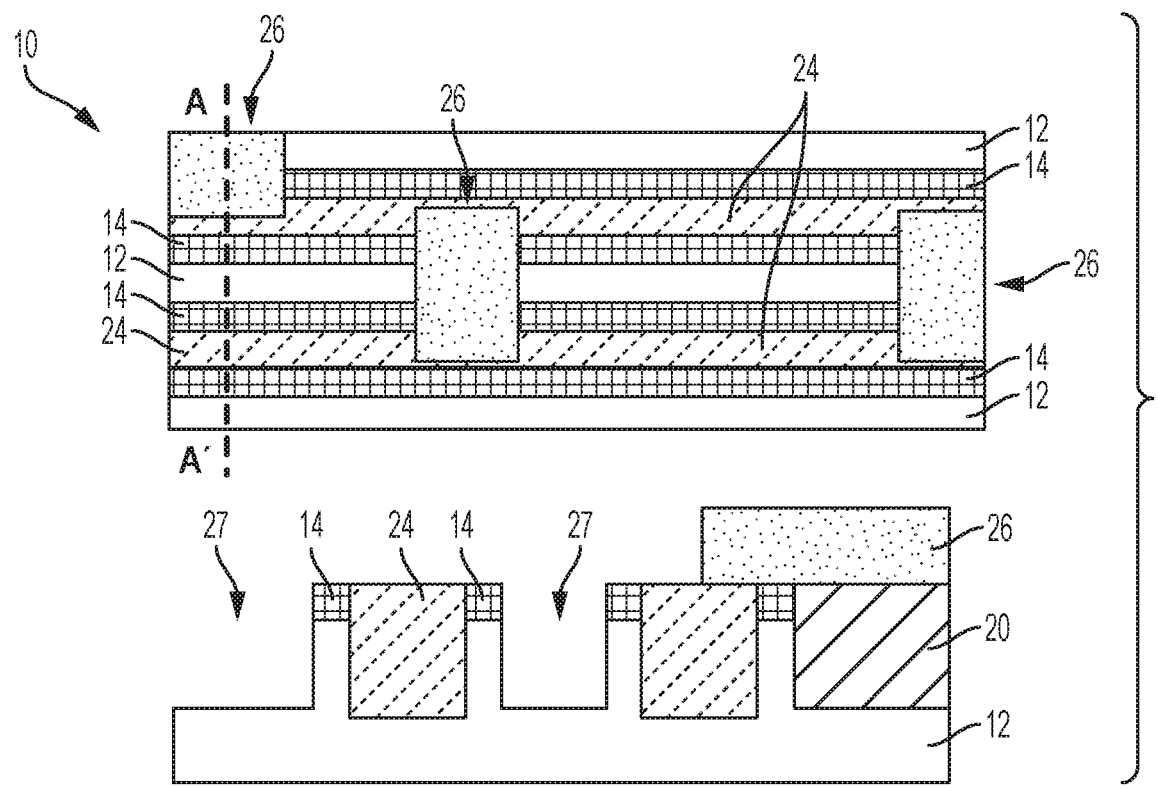
FIG. 7 depicts a top down view and a cross sectional view taken along lines A-A of the top down view of the semiconductor structure of FIG. 6 subsequent to selectively etching the exposed nitride that is not protected by the block mask.

FIG. 7 depicts a top down view and a cross sectional view taken along lines A-A of the top down view of the semiconductor structure 10 of FIG. 6 subsequent to selectively etching the exposed nitride 20 to provide openings 27 in the non-mandrel region that is not protected by the block mask 26.

Figure 8:
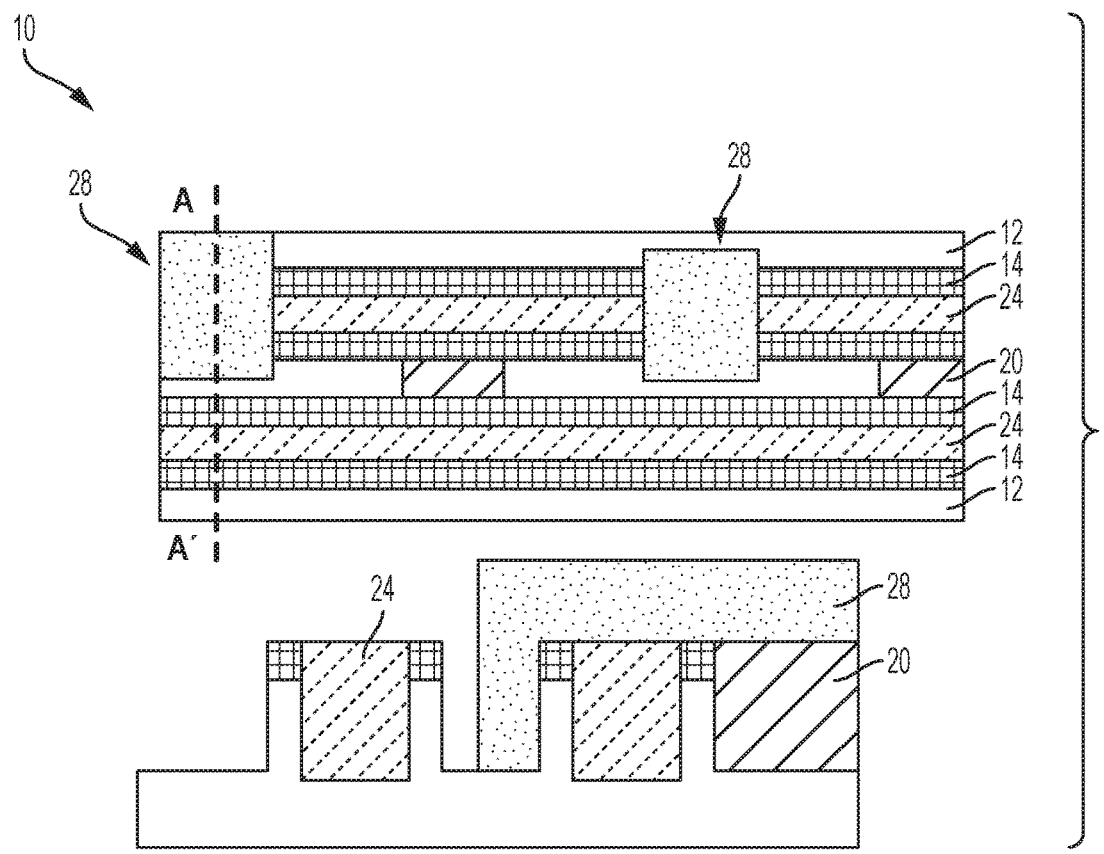
FIG. 8 depicts a top down view and a cross sectional view taken along lines A-A of the top down view of the semiconductor structure of FIG. 7 subsequent to applying a block mask to pattern the mandrel region.

FIG. 8 depicts a top down view and a cross sectional view taken along lines A-A of the top down view of the semiconductor structure 10 of FIG. 7 subsequent to applying a second block mask 28 to pattern the mandrel region (regions of the substrate generally overlying the mandrel pattern as shown). Again, a large process window is provided to selectively define the metal interconnect line ends in the mandrel region given the distance between adjacent oxide layers 24. For example, a portion of the block mask 28 can extend into the trench openings 22 provided by selective etch of the nitride 20 in the prior step. The particular location of the block mask is not intended to be limited to that shown and will generally depend on the intended design considerations for the interconnect level.

Figure 9:
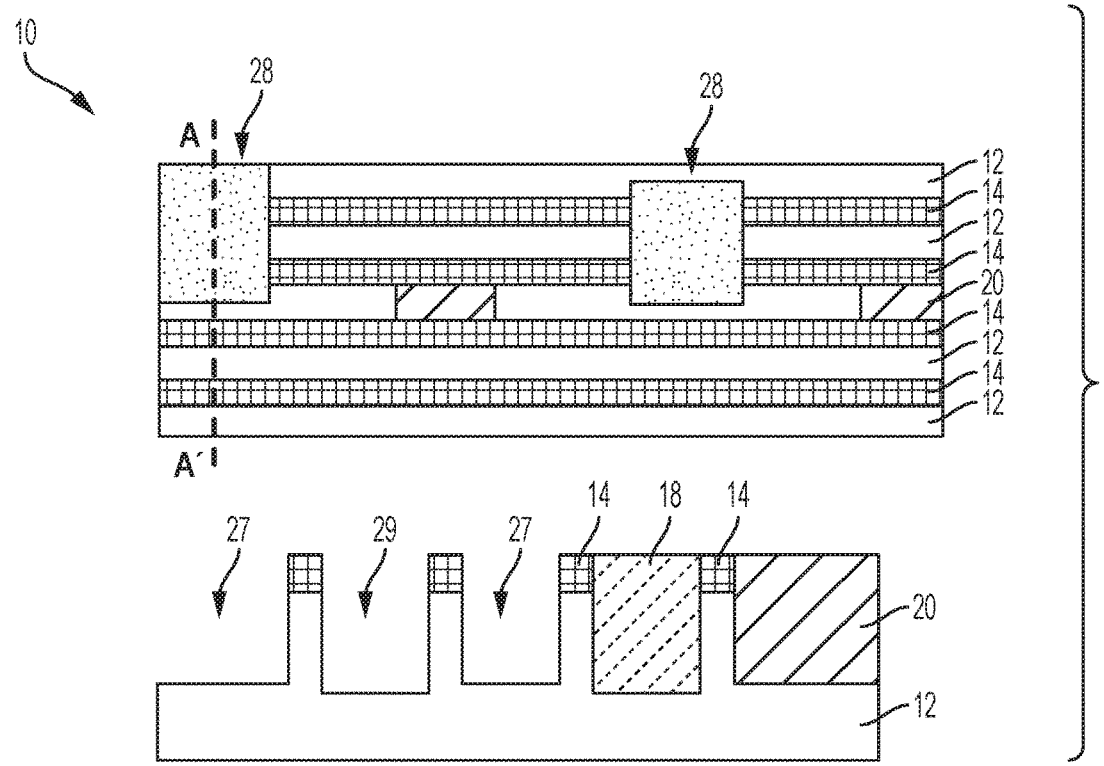
FIG. 9 depicts a top down view and a cross sectional view taken along lines A-A of the top down view of the semiconductor structure of FIG. 8 subsequent to a directional etch process to remove the exposed oxide in the mandrel region.

FIG. 9 depicts a top down view and a cross sectional view taken along lines A-A of the top down view of the semiconductor structure 10 of FIG. 8 subsequent to a directional etch process such as a reactive ion etch process to remove the exposed oxide 24 and form openings 29 in the mandrel region.

Figure 10:
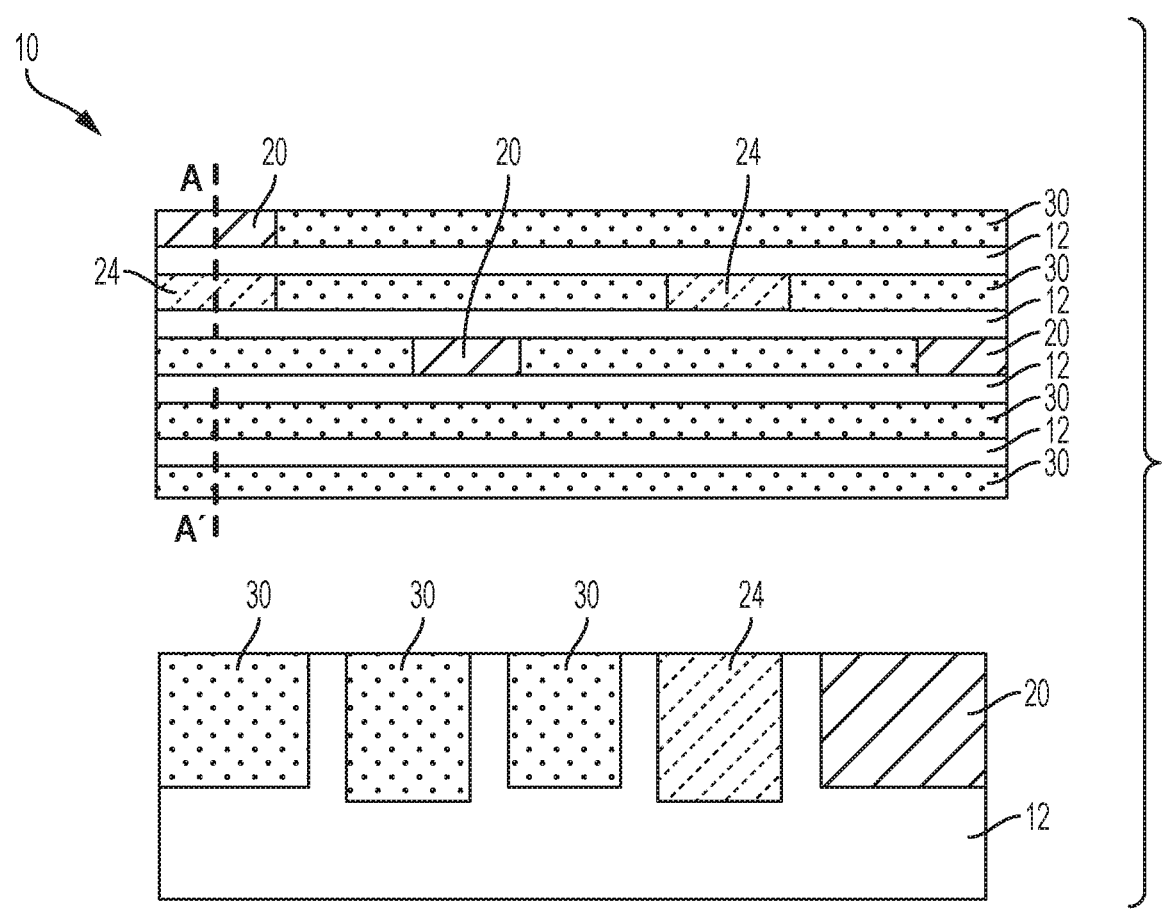
FIG. 10 depicts a top down view and a cross sectional view taken along lines A-A of the top down view of the semiconductor structure of FIG. 9 subsequent to a metal conductor fill process to fill the openings provided by selective removal of the oxide layer in the mandrel region and the nitride layer in the non-mandrel region.

FIG. 10 depicts a top down view and a cross sectional view taken along lines A-A of the top down view of the semiconductor structure 10 of FIG. 9 subsequent to a metal conductor fill process to fill the openings with a metal conductor 30 provided by selective removal of the oxide layer 24 in the mandrel region (i.e., fill openings 29) and the nitride layer 20 in the non-mandrel region (i.e., fill openings 27). As shown more clearly in the top down view, a portion of the nitride 20 protected by block mask 26 is provided between line ends within a single metal conductor line and a portion of the oxide 24 protected by block mask 28 is provided between line ends within another single metal conductor line.

The metal conductor fill process generally includes conformal deposition of a liner layer (i.e., diffusion barrier layer) (not shown) onto the structure 10. For example, tantalum, tantalum nitride, cobalt, ruthenium, titanium, titanium nitride, tungsten nitride, and combinations of more than one material (for example tantalum nitride/tantalum or tantalum nitride/cobalt). The presence of the liner layer such as titanium nitride, for example, insures that a metal such as copper, which can participate in interdiffusion during subsequent annealing processes, will not further diffuse ultralow k dielectric 12. The liner layer can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal conductor lines 30 can be formed by CVD, sputtering, electrochemical deposition or like processes. For example, the deposition of copper can proceed by electrochemical deposition such as electroplating or electroless plating.

Following formation of the metal conductor lines 30, the substrate is subjected to a planarization process to remove any metal overburden (includes the seed layer, the liner layer, and hardmask layer 14 removal) such that a top surface of the metal is substantially coplanar to the ultralow k dielectric layer 12, the oxide layer 24 where present, and the nitride layer 20 where present as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. Such a structure is often referred to as a recessed structure. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Figure 11:
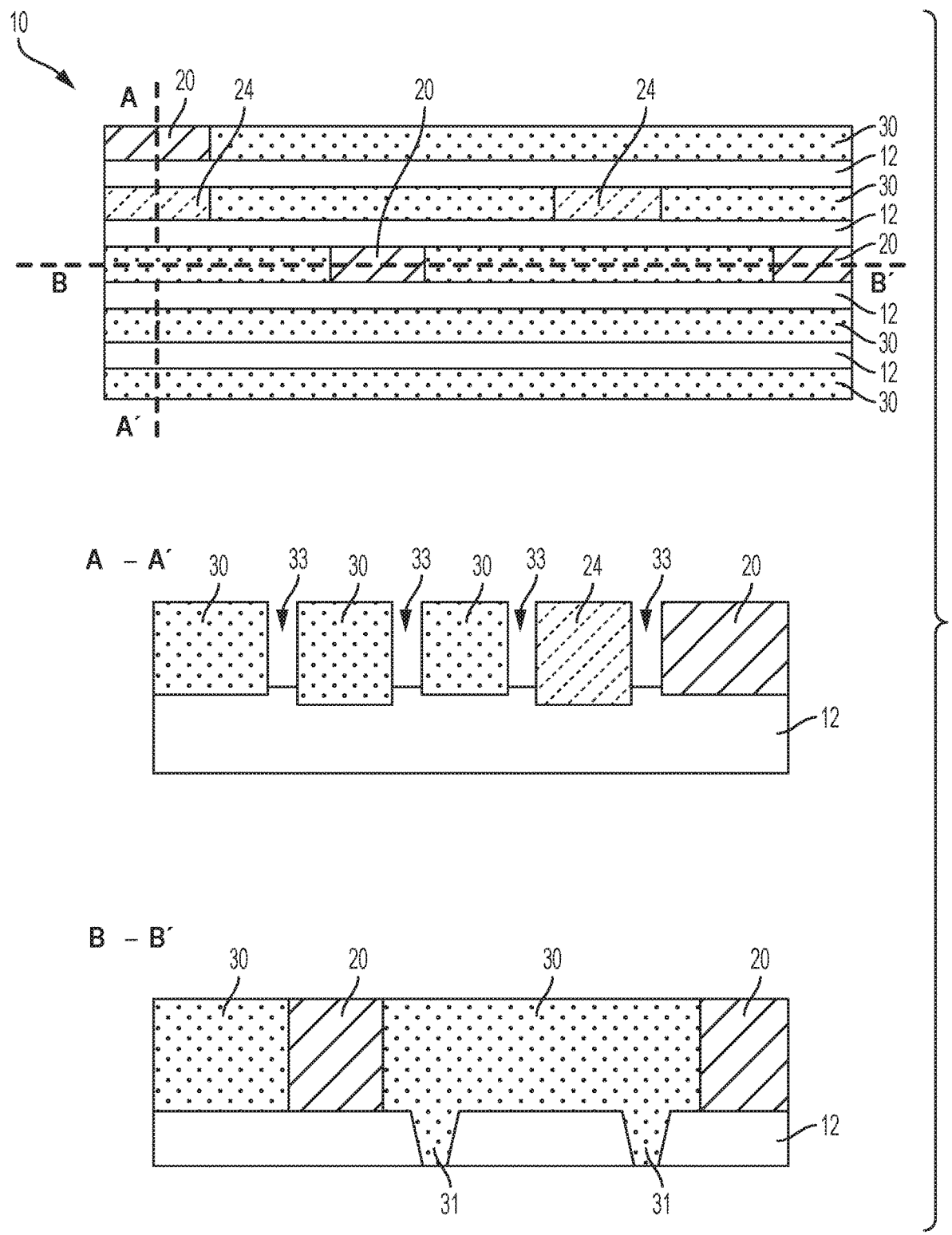
FIG. 11 depicts a top down view and a cross sectional views taken along lines A-A and B-B of the top down view of the semiconductor structure of FIG. 10 subsequent to directionally etching the ultra-low k dielectric between adjacent metal lines to form openings therein.

FIG. 11 depicts a top down view and a cross sectional views taken along lines A-A and B-B of the top down view of the semiconductor structure 10 of FIG. 10 subsequent to directionally etching, e.g., reactive ion etch, the ultra-low k dielectric 12 that is generally between adjacent metal lines 30. The etch depth is about equal to a thickness of the metal line. As shown in the cross sectional view taken along lines A-A, removal of the ultralow k dielectric forms trench openings 33 between the metal lines 30. As shown in the cross sectional view taken along lines B-B, the presence of the nitride at the line ends advantageously serves as anchors to prevent the metal conductor line from falling over when the oxide 24 is removed. Additionally, the interconnect level can further include vias 31 for connecting the interconnect level to an underlying interconnect level.

Figure 12:
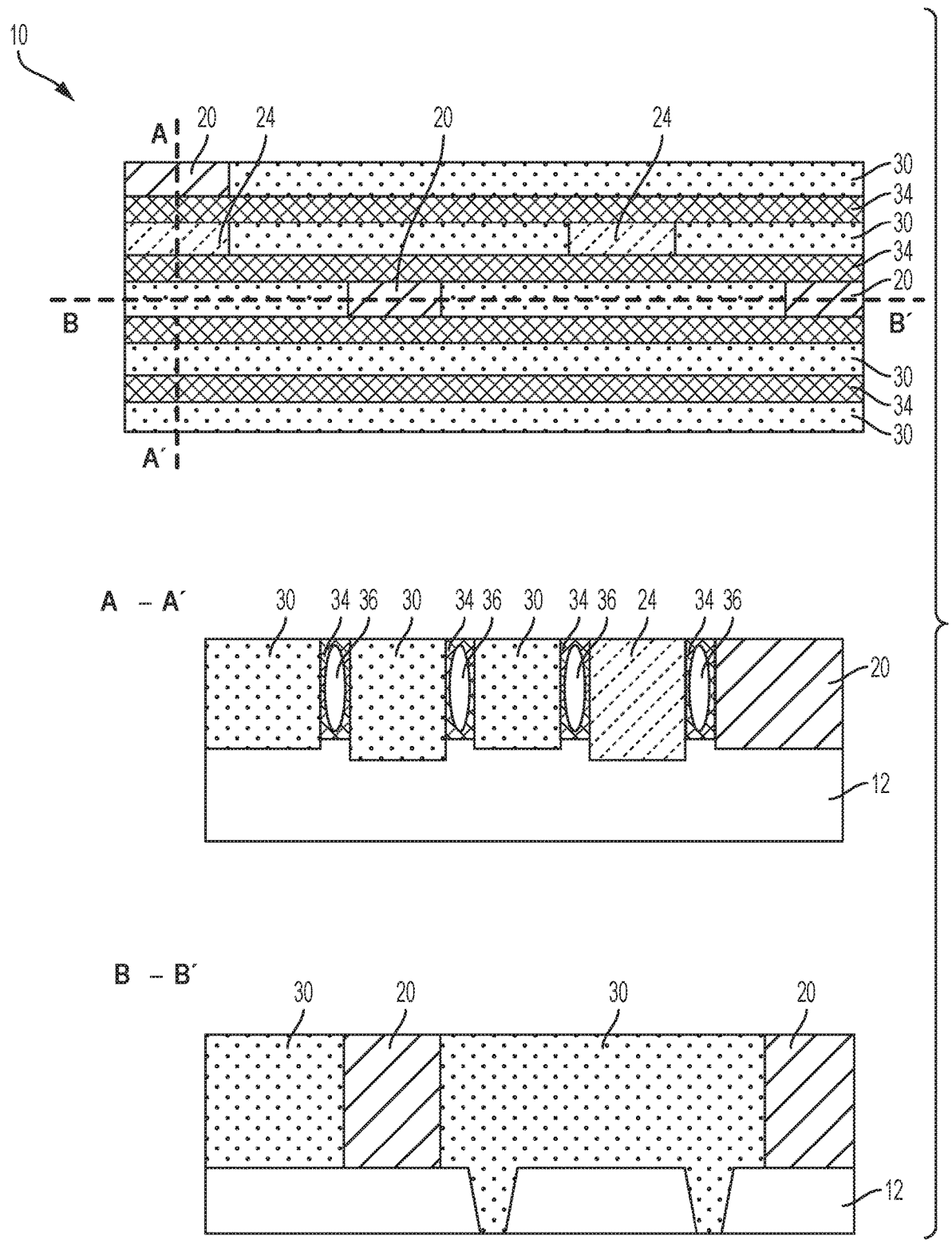
FIG. 12 depicts a top down view and a cross sectional views taken along lines A-A and B-B of the top down view of the semiconductor structure of FIG. 11 subsequent to non-conformal deposition of a ultra-low k film into the openings to form airgap therein.

FIG. 12 depicts a top down view and a cross sectional views taken along lines A-A and B-B of the top down view of the semiconductor structure 10 of FIG. 11 subsequent to non-conformal deposition of a ULK dielectric 34 into the trench openings 33. As noted above, the openings have a width generally defined by the sidewall spacers 18. In one or more embodiments, the sidewall spacers 18 have a width dimension of less than 20 nm; in one or more other embodiments, the sidewall spacers 18 have a width dimension of less than 15 nm; and in still one or more other embodiments, the sidewall spacers 18 have a width dimension of less than 10 nm. Non-conformal deposition in combination with the opening width results in pinch off and formation of an airgap 36 therein. As such, the resulting structure provides airgaps within a deposited dielectric between tightly pitched metal lines.

Figure 13:
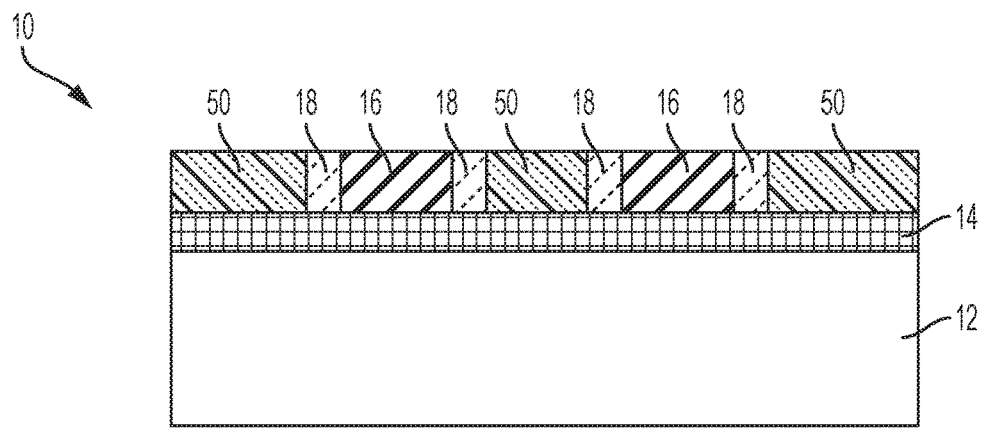
FIG. 13 depicts the cross sectional view of a semiconductor device 10 of FIG. 2 above subsequent to deposition of a nitride layer adjacent the sidewall oxide spacers 18 in the aSi mandrel pattern.

FIGS. 13-24 depict a method and structure of forming an airgap using SADP during BEOL processing to form tightly pitched interconnect lines in accordance with one or more other embodiments. FIG. 13 FIG. depicts the cross sectional view of a semiconductor device 10 of FIG. 2 above subsequent to deposition of a nitride layer 50 adjacent the sidewall oxide spacers 18 in the aSi mandrel pattern 16. Subsequent to deposition, a planarization process is used such that the upper surfaces of the mandrel 16, the oxide spacers and the nitride are coplanar to one another.

Figure 14:
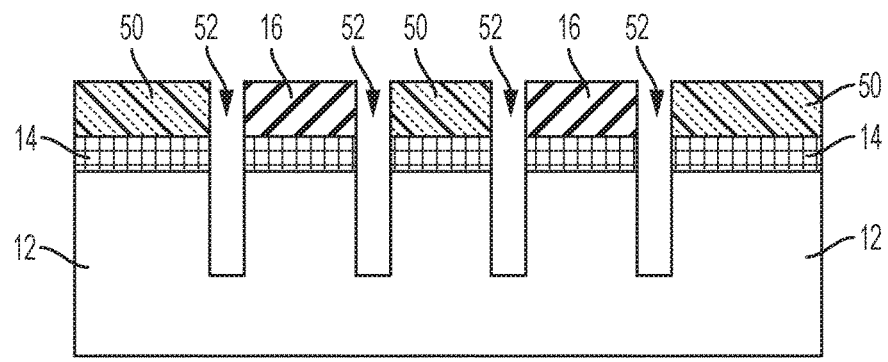
FIG. 14 depicts a cross sectional view of a semiconductor device of FIG. 13 subsequent to selective etch of the sidewall oxide spacers and formation of trenches into the ultralow k dielectric.

FIG. 14 depicts the cross sectional view of a semiconductor device 10 of FIG. 13 subsequent to selective etch of the sidewall oxide spacers 18. The nitride layer 50 and the aSi mandrel pattern 16 are then used to form a trench opening 52 into the ultralow k dielectric 12.

Figure 15:
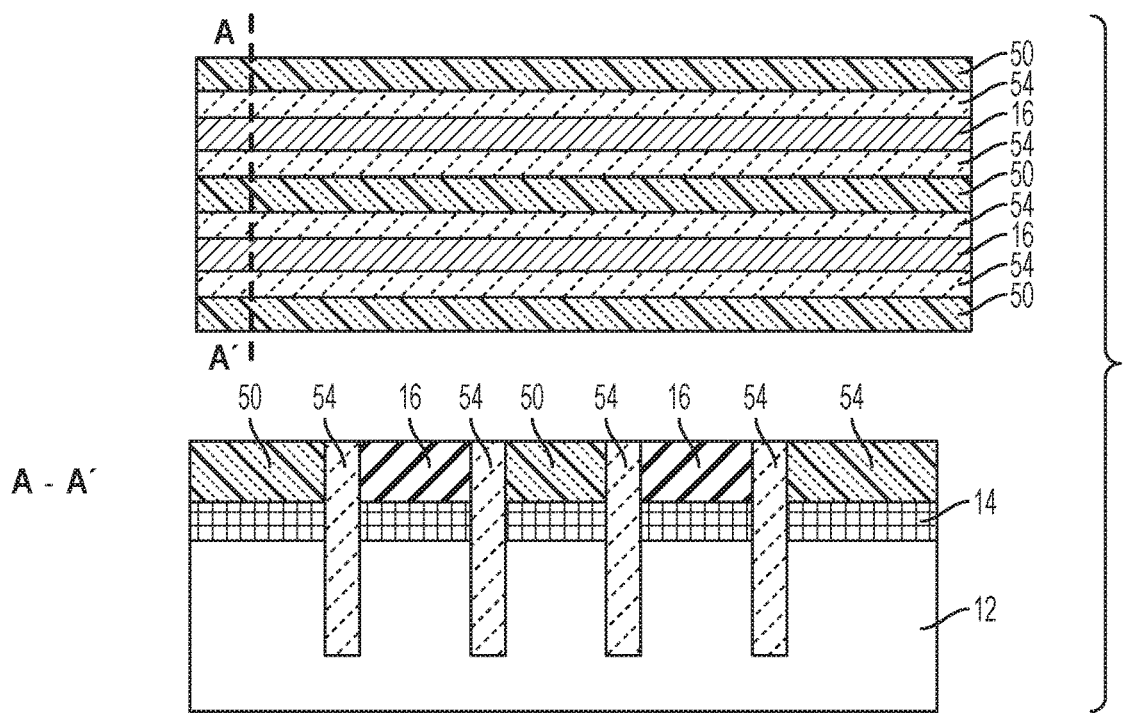
FIG. 15 depicts a top down view and a cross sectional view taken along lines A-A of the semiconductor device of FIG. 14 subsequent to deposition of an oxide in the trenches followed by a planarization process.

FIG. 15 depicts a top down view and a cross sectional view taken along lines A-A of the semiconductor device 10 of FIG. 14 subsequent to deposition of an oxide 54 in the trench openings 52 followed by a planarization process to remove any oxide overburden and to planarized the uppermost surface of the semiconductor device 10. The oxide 54 can be the same or different from the previously deposited sidewall oxide dielectric 18.

Figure 16:
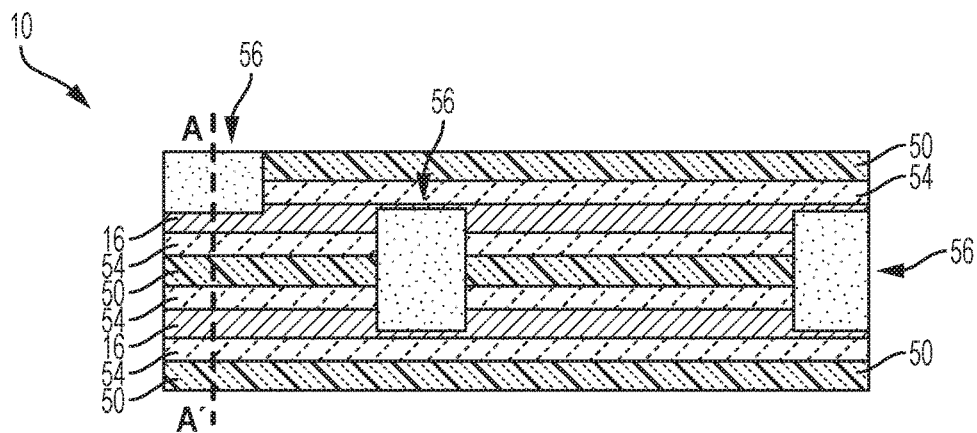
FIG. 16 depicts a top down view and a cross sectional view taken along lines A-A of the semiconductor device of FIG. 15 subsequent to deposition of block mask for patterning the non-mandrel region.
Figure 16:
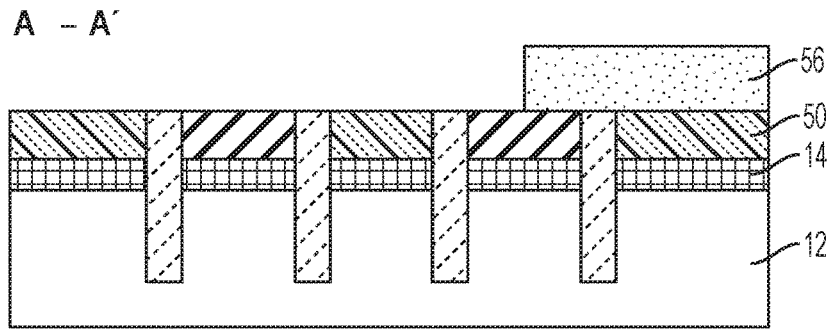

FIG. 16 depicts a top down view and a cross sectional view taken along lines A-A of the semiconductor device 10 of FIG. 15 subsequent to deposition of block mask 56 for patterning the non-mandrel region. For reasons generally described above, a large process window is provided to define the metal line ends in the non-mandrel region. The particular location of the block mask 56 is not intended to be limited to that shown and will generally depend on the intended design considerations for the interconnect level.

Figure 17:
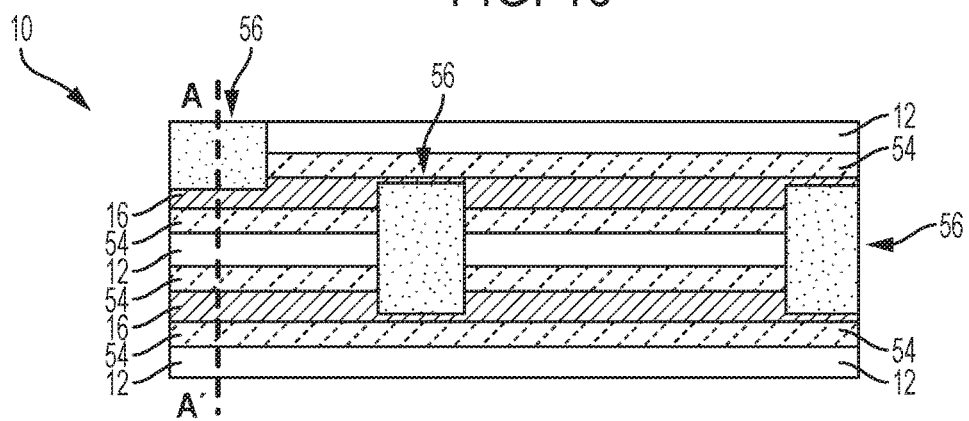
FIG. 17 depicts a top down view and a cross sectional view taken along lines A-A of the semiconductor device of FIG. 16 subsequent to selective removal of the exposed nitride in the non-mandrel region to form trench openings.
Figure 17:
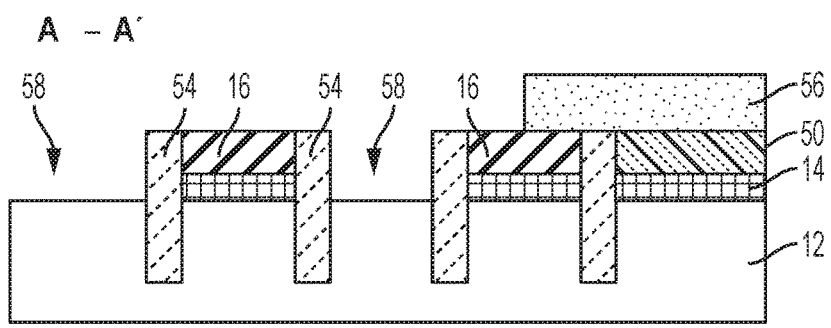

FIG. 17 depicts a top down view and a cross sectional view taken along lines A-A of the semiconductor device 10 s of FIG. 16 subsequent to selective removal of the exposed nitride in the non-mandrel region to form trench openings 58.

Figure 18:
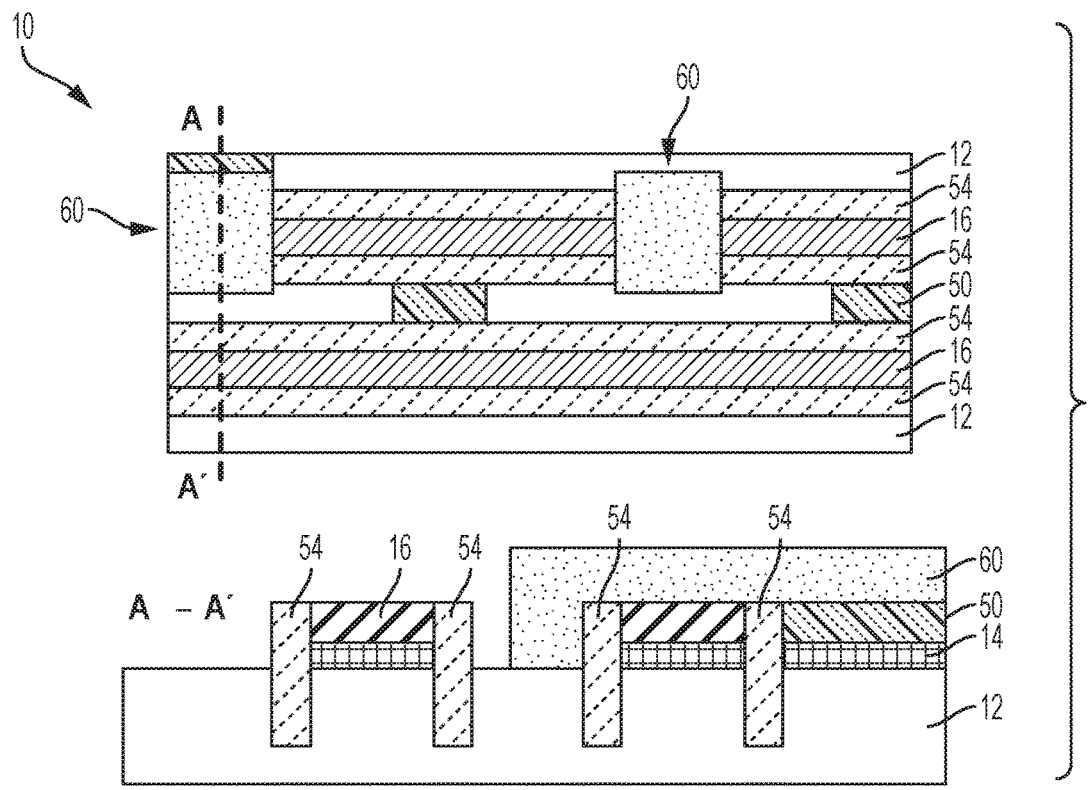
FIG. 18 depicts a top down view and a cross sectional view taken along lines A-A of the semiconductor device of FIG. 17 subsequent to deposition of block mask for patterning the mandrel region.

FIG. 18 depicts a top down view and a cross sectional view taken along lines A-A of the semiconductor device 10 of FIG. 17 subsequent to deposition of block mask 60 for patterning the mandrel region. For reasons generally described above, a large process window is provided to define the metal line ends in the non-mandrel region. The particular location of the block mask 60 is not intended to be limited to that shown and will generally depend on the intended design considerations for the interconnect level.

Figure 19:
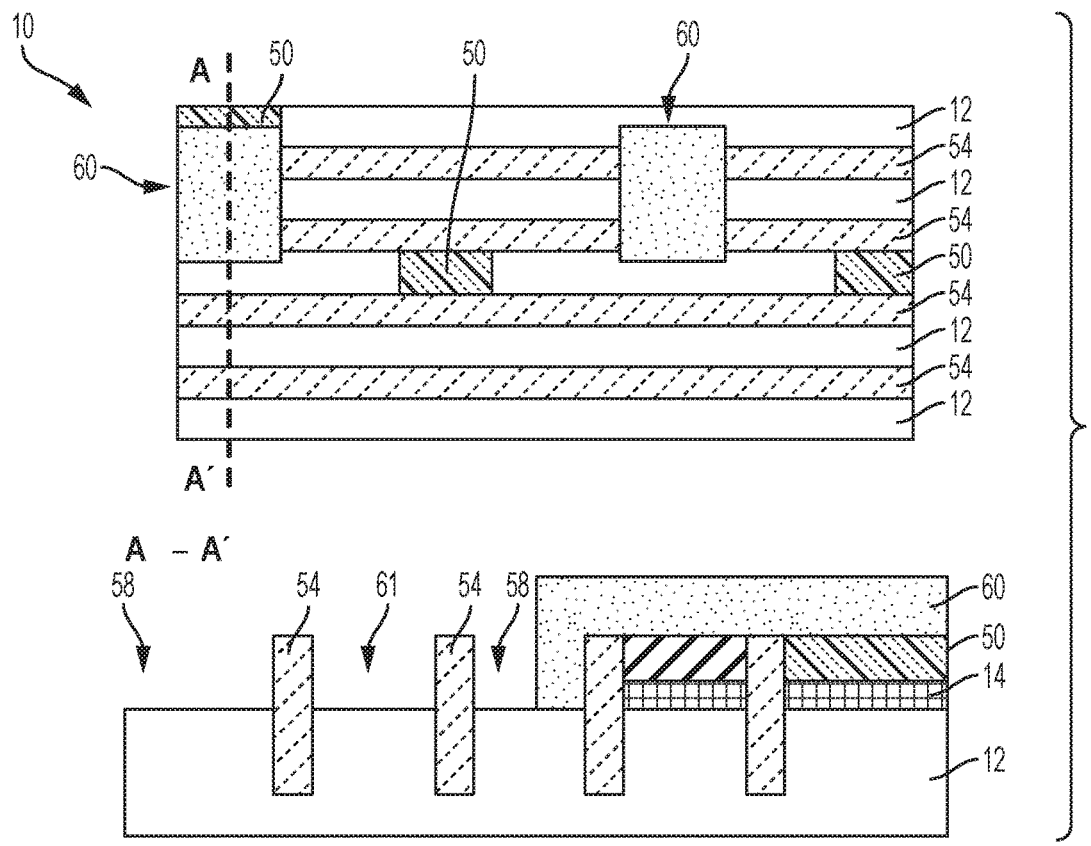
FIG. 19 depicts a top down view and a cross sectional view taken along lines A-A of the semiconductor device of FIG. 18 subsequent to selective removal of the exposed aSi mandrel pattern and hardmask in the mandrel region to form trench openings.

FIG. 19 depicts a top down view and a cross sectional view taken along lines A-A of the semiconductor device 10 of FIG. 18 subsequent to selective removal of the exposed aSi mandrel pattern 16 and hardmask 14 in the mandrel region to form trench openings 61.

Figure 20:
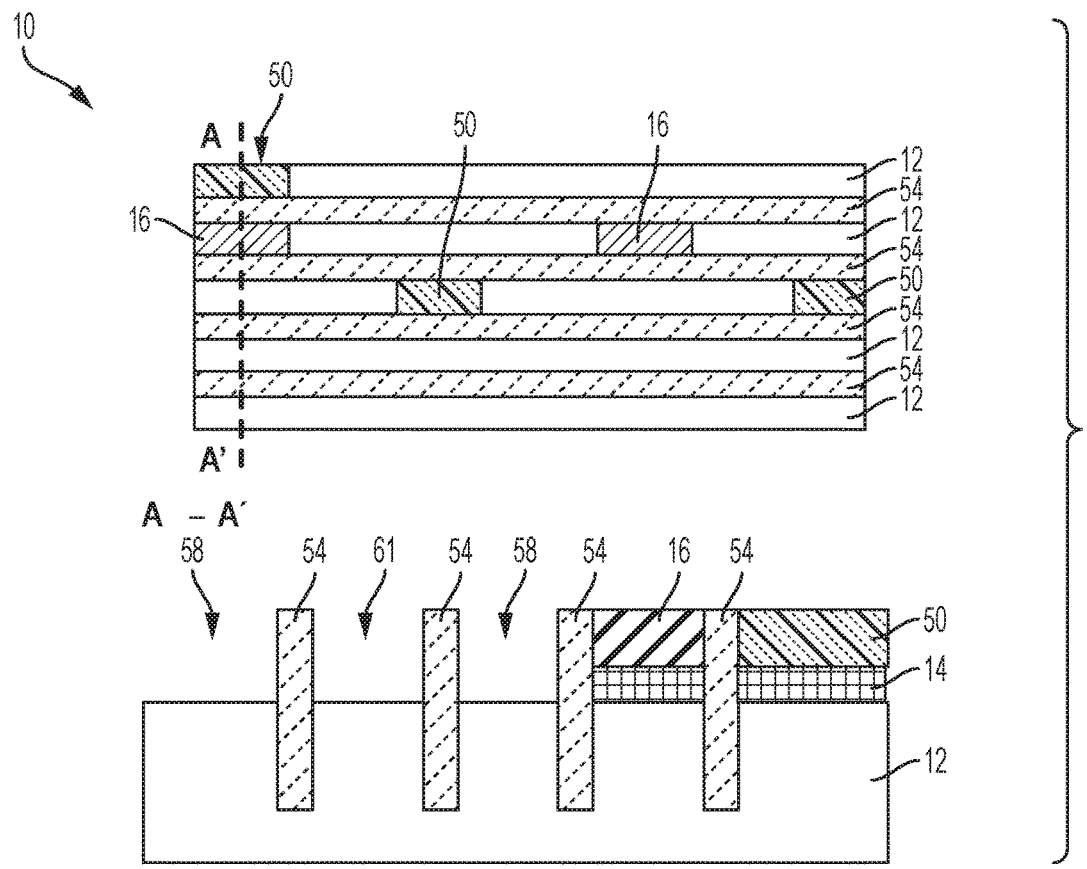
FIG. 20 depicts a top down view and a cross sectional view taken along lines A-A of the semiconductor device of FIG. 19 subsequent to selective removal of the block mask.

FIG. 20 depicts a top down view and a cross sectional view taken along lines A-A of the semiconductor device 10 of FIG. 19 subsequent to selective removal of the block mask 60. As shown in the top down view, the resulting structure 10 includes lines including nitride 50 between line ends.

Figure 21:
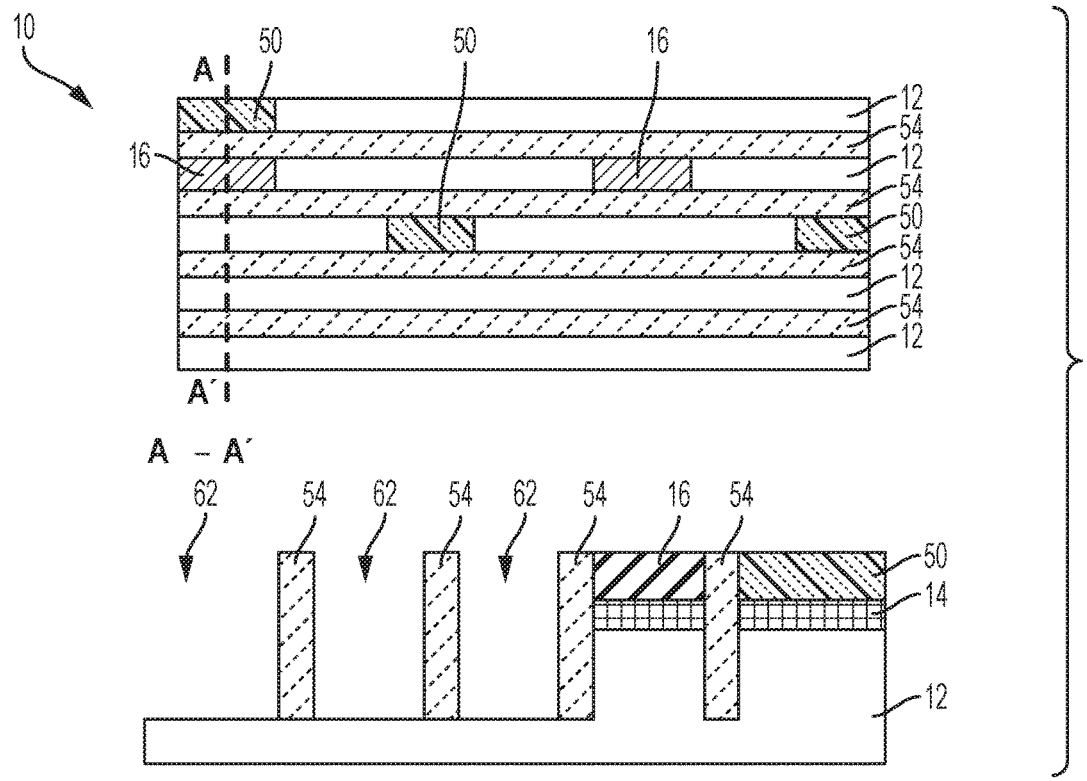
FIG. 21 depicts a top down view and a cross sectional view taken along lines A-A of the semiconductor device of FIG. 20 subsequent to directional etch into the exposed ultralow k dielectric layer to form trench openings.

FIG. 21 depicts a top down view and a cross sectional view taken along lines A-A of the semiconductor device 10 of FIG. 20 subsequent to directional etch into the exposed ultralow k dielectric layer 12 to form deeper trench openings 62.

Figure 22:
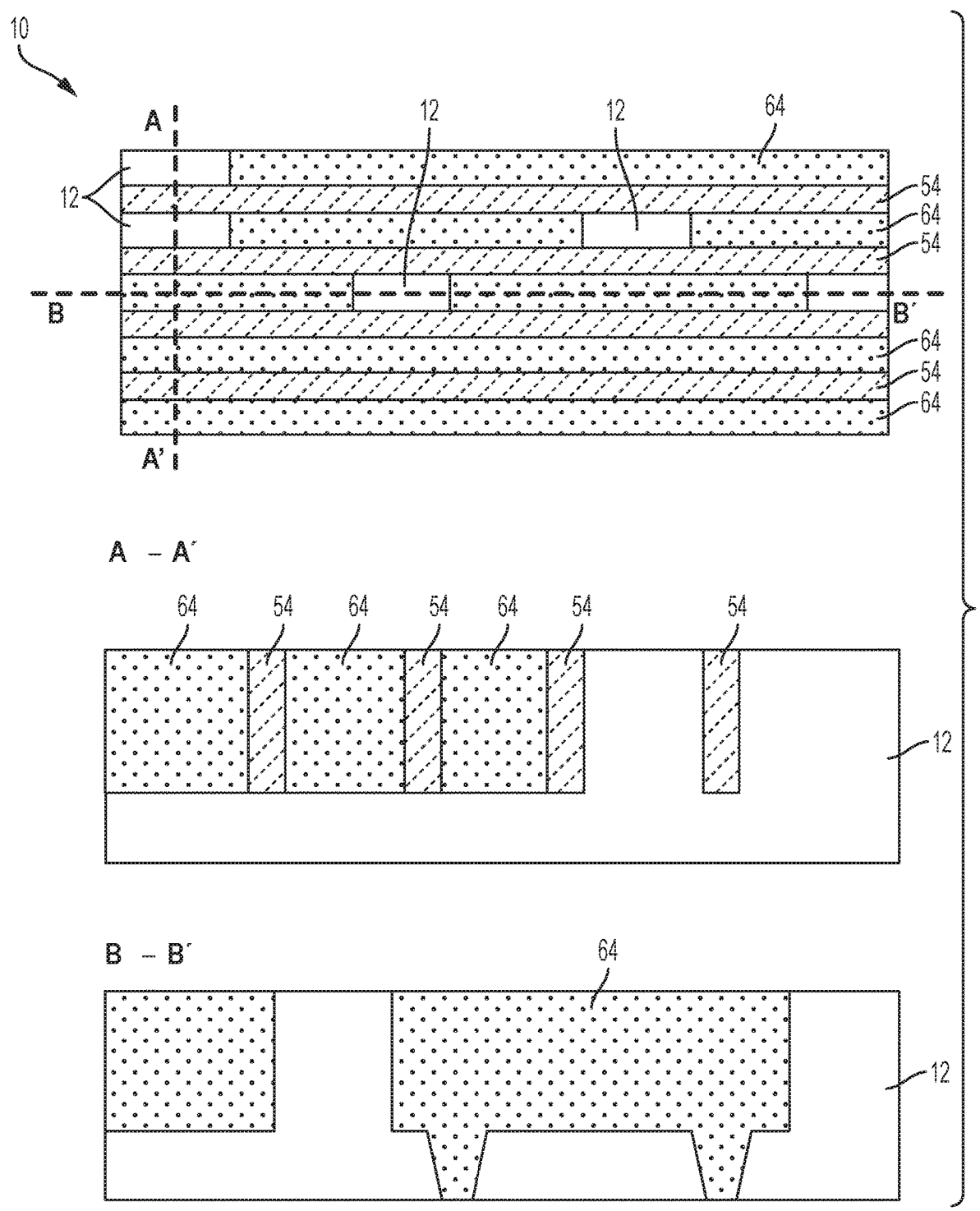
FIG. 22 depicts a top down view and a cross sectional views taken along lines A-A and B-B of the top down view of the semiconductor structure of FIG. 21 subsequent to a metal conductor fill process to fill the trench openings.

FIG. 22 depicts a top down view and a cross sectional views taken along lines A-A and B-B of the top down view of the semiconductor structure 10 of FIG. 21 subsequent to a metal conductor fill process to fill the trench openings 62 formed in the preceding step followed by a planarization process to remove any overburden, the remaining aSi mandrel pattern 16, the remaining nitride 54, and the remaining hardmask 14 and a portion of the ultralow k dielectric layer. As shown in the cross sectional view taken along lines A-A of the top down view, the oxide 54 is provided between the adjacent metal lines 64. As shown in the cross sectional view taken along lines B-B of the top down view, the ultralow k dielectric 12 is provided intermediate the line ends within a single metal conductor line 64.

Figure 23:
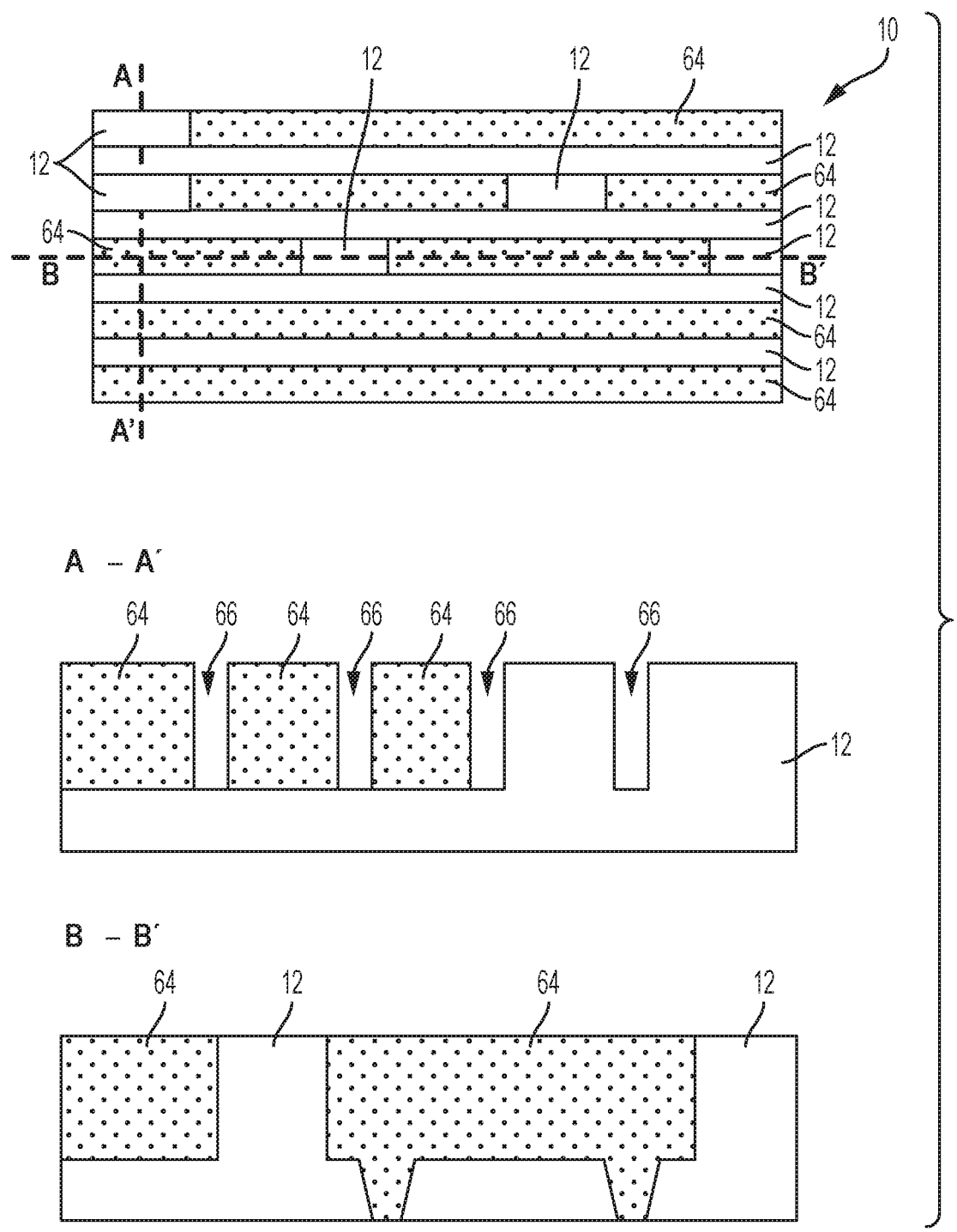
FIG. 23 depicts a top down view and a cross sectional views taken along lines A-A and B-B of the top down view of the semiconductor structure of FIG. 22 subsequent to a selective oxide etch to remove the oxide between adjacent metal lines and form openings.

FIG. 23 depicts a top down view and a cross sectional views taken along lines A-A and B-B of the top down view of the semiconductor structure 10 of FIG. 22 subsequent to a selective oxide etch to remove the oxide 54 between adjacent metal lines and form trench openings 66. As for the line ends within a line, the ultralow k dielectric serves to anchor the lines to prevent the metal lines from flopping over as shown in the cross sectional views taken along lines B-B of the top down view of the semiconductor structure 10.

Figure 24:
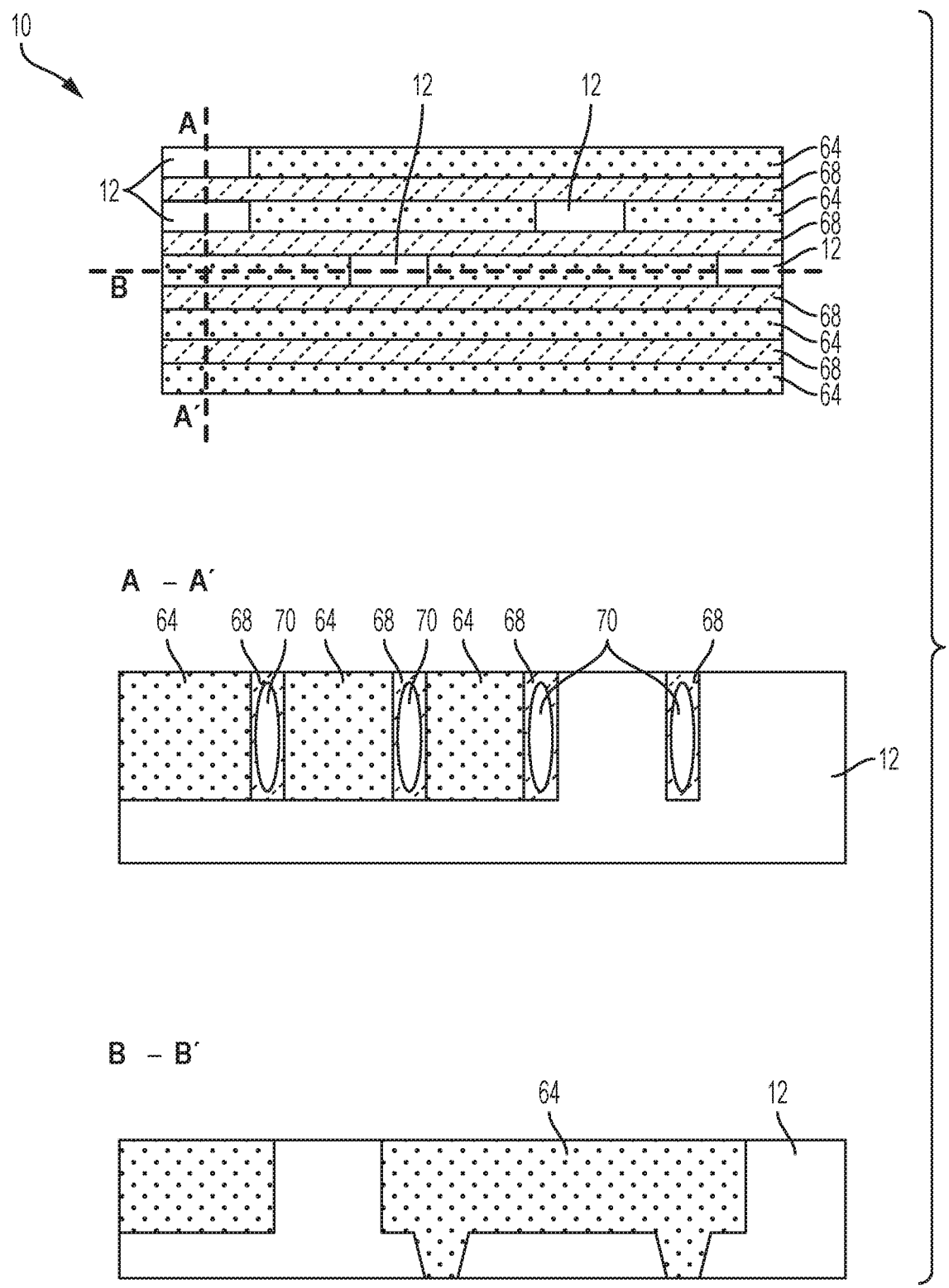
FIG. 24 depicts a top down view and a cross sectional views taken along lines A-A and B-B of the top down view of the semiconductor structure FIG. 23 subsequent to non-conformal deposition of a ULK film 68 into the openings to form airgaps therein.

FIG. 24 depicts a top down view and a cross sectional views taken along lines A-A and B-B of the top down view of the semiconductor structure 10 of FIG. 23 subsequent to non-conformal deposition of an oxide 68 into the openings 66. Non-conformal deposition results in pinch off and formation of an airgap 70 therein. As such, the resulting structure provides a dielectric including airgaps therein between tightly pitched metal lines.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A back end of the line (BEOL) interconnect structure comprising:
   a plurality of lines comprising a metal conductor separated by a space having a width of less than 20 nm, wherein the plurality of metal conductor lines are provided on an ultralow k dielectric; and
   an oxide provided in the space including an airgap therein, the oxide directly encircling the airgap and being in direct contact with the ultralow k dielectric, wherein the airgap and one of the plurality of metal conductor lines sandwich the oxide with no intervening layer.

2. The BEOL interconnect structure of claim 1, wherein the metal conductor comprises Cu, Co, Al, AlCu, Ti, TiN, Ta, TaN, W, WN, MoN, Pt, Pd, Os, Ru, IrO2, ReO2, ReO3, alloys thereof, or mixtures thereof.

3. The BEOL interconnect structure of claim 1, wherein the metal conductor comprises copper or copper and an alloying element.

4. The BEOL interconnect structure of claim 3, wherein the alloying element is in an amount from about 0.001 weight percent (wt. %) to about 10 wt %.

5. The BEOL interconnect structure of claim 1, wherein the ultralow k dielectric is intermediate line ends.

6. A back end of the line (BEOL) interconnect structure comprising:
- a plurality of lines comprising a metal conductor separated by a space having a width of less than 20 nm, wherein the plurality of metal conductor lines are provided on an ultralow k dielectric;
- an oxide provided in the space including an airgap therein; and
- a first insulator intermediate line ends of at least one of the plurality of the plurality of metal conductor lines corresponding to a mandrel region and a second insulator intermediate line ends of at least one of the plurality of the plurality of metal conductor lines corresponding to a non-mandrel region, wherein the first insulator is a different material than the second insulator.

7. The BEOL interconnect structure of claim 1, wherein an oxide and/or a nitride is intermediate line ends.

8. The BEOL interconnect structure of claim 1, wherein the plurality of lines is at a pitch of 40 nm or less.

9. The BEOL interconnect structure of claim 1 further comprising a via in electrical communication with one or more of the plurality of lines, wherein the via comprises the same metal conductor as the plurality of lines.

10. The BEOL interconnect structure of claim 1 further comprising a via in electrical communication with one or more of the plurality of lines, wherein the via comprises a different metal conductor than the plurality of lines.

11. The BEOL interconnect structure of claim 1, wherein the ultralow k dielectric comprises porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof.

12. The BEOL interconnect structure of claim 1, wherein the airgap is between each of the plurality of metal conductor lines.

* * * * *